(12) United States Patent
Higeta et al.

(10) Patent No.: US 6,791,895 B2
(45) Date of Patent: Sep. 14, 2004

(54) SEMICONDUCTOR MEMORY DEVICE

(75) Inventors: Keiichi Higeta, Hamura (JP); Shigeru Nakahara, Musashimurayama (JP); Hiroaki Nambu, Sagamihara (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/671,475

(22) Filed: Sep. 29, 2003

(65) Prior Publication Data

US 2004/0057329 A1 Mar. 25, 2004

Related U.S. Application Data

(62) Division of application No. 10/198,925, filed on Jul. 22, 2002, now Pat. No. 6,657,887.

(30) Foreign Application Priority Data

Aug. 9, 2001 (JP) ........................................ 2001-241594

(51) Int. Cl.[7] ............................ G11C 7/00; G11C 11/00
(52) U.S. Cl. ................... 365/226; 365/156; 365/230.06
(58) Field of Search ................................ 365/226, 156, 365/154, 230.06, 230.08, 207

(56) References Cited

U.S. PATENT DOCUMENTS

| 5,276,652 A | * | 1/1994 | Anami ........................ 365/227 |
| 5,677,889 A | | 10/1997 | Haraguchi et al. .......... 365/226 |
| 5,757,702 A | | 5/1998 | Iwata et al. ............. 365/189.05 |
| 5,875,133 A | | 2/1999 | Miyashita et al. ...... 365/189.09 |
| 5,978,299 A | * | 11/1999 | Yamasaki et al. ........... 365/226 |
| 6,009,023 A | * | 12/1999 | Lu et al. ................. 365/189.11 |
| 6,046,627 A | | 4/2000 | Itoh et al. .................... 327/546 |
| 6,316,812 B1 | | 11/2001 | Nagaoka ..................... 257/369 |
| 2001/0006476 A1 | | 7/2001 | Itoh et al. .................... 365/156 |
| 2002/0027256 A1 | | 3/2002 | Ishibashi et al. ............. 257/391 |

FOREIGN PATENT DOCUMENTS

| JP | 58-161195 | 3/1982 |
| JP | 2-295164 | 5/1989 |
| JP | 3-83289 | 8/1989 |
| JP | 2115704 | 4/1990 |
| JP | 5-120882 | 10/1991 |
| JP | 8-69693 | 8/1994 |
| JP | 9-51042 | 2/1996 |
| JP | 10-242839 | 2/1997 |
| WO | WO 97/38444 | 4/1997 |

OTHER PUBLICATIONS

Takakuni Douseki and Shin–ichiro Mutoh, "Static–Noise Margin Analysis for a Scaled–Down CMOS Memory Cell", Journal of Institute of Electronics Information and Communication Engineers C–11, (Jul. 1992), vol. J75–c–11 No. 7, pp. 350–361.

T. Inukai, M. Takamiya, K. Nose, H. Kawaguchi, T. Hiramoto and T. Sakurai, "Boosted Gate MOS (BGMOS): Device/Circuit Cooperation Scheme to Achieve Leakage––Free Giga–Scale Integration", IEEE 2000 Custom Integrated Circuits Conference, pp. 409–412.

* cited by examiner

*Primary Examiner*—Anh Phung
(74) *Attorney, Agent, or Firm*—Reed Smith LLP; Stanley P. Fisher, Esq.; Juan Carlos A. Marquez, Esq.

(57) ABSTRACT

A semiconductor memory device having a memory array comprising CMOS flip-flop circuit type memory cells, which is capable of improving a noise margin, making a read rate fast and reducing power consumption. In the semiconductor memory device, an operating voltage of the memory cell is set higher than an operating voltage of each of peripheral circuits. Threshold voltages of MOS transistors that constitute the memory cell, are set higher than those of MOS transistors constituting the peripheral circuit. A gate insulting film for the MOS transistors that constitute the memory cell, is formed so as to be regarded as thicker than a gate insulting film for the MOS transistors constituting the peripheral circuit when converted to an insulating film of the same material. Further, a word-line selection level and a bit-line precharge level are set identical to the level of the operating voltage of the peripheral circuit.

8 Claims, 9 Drawing Sheets

SEMICONDUCTOR MEMORY DEVICE

This application is a Divisional of nonprovisional U.S. application Ser. No. 10/198,925 filed on Jul. 22, 2002 now U.S. Pat. No. 6,657,887, filed on Dec. 2, 2003. Priority is claimed based upon U.S. application Ser. No. 10/198,925 filed on Jul. 22, 2002, which claims the priority of Japanese Application No. 2001-241594 filed on Aug. 9, 2001.

BACKGROUND OF THE INVENTION

The present invention relates to a semiconductor memory device and a technology for improving a noise margin and an operating speed of an SRAM (Static Random Access Memory) and achieving low power consumption thereof, e.g., a technology effective for application to an SRAM having CMOS flip-flop circuit type memory cells or an LSI (Large Scale Integration) with the SRAM built therein.

In a semiconductor memory device (hereinafter called a "semiconductor memory" or simply "memory") such as an SRAM, an increase in capacity has been put forward with the scale-down of an elemental device by a process. On the other hand, when process-based scale-down is effected according to a so-called scaling law in a semiconductor memory comprising MOSFETs, a gate insulating film for MOSFETs constituting a memory cell and a peripheral circuit becomes thin. Therefore, a withstand voltage of each MOSFET becomes low with the scale-down. In a semiconductor integrated circuit, the lower a source or power supply voltage, the less its power consumption. Further, as the MOSFET becomes low in threshold voltage, the semiconductor integrated circuit can perform a high-speed operation. Therefore, a reduction in power supply voltage has been carried out with the scale-down.

Meanwhile, when a threshold voltage of each MOSFET that constitutes a memory cell, is reduced or a source or power supply voltage for the memory cell is lowered in the SRAM, a defective condition takes place in that a leak current increases and a static noise margin is reduced, and a so-called soft error in which memory information is reversed due to an a ray, is apt to occur.

There has heretofore been proposed an invention wherein in order to prevent an increase in leak current due to a reduction in threshold voltage of each MOSFET constituting a memory cell and improve an operating speed, the threshold voltage of each MOSFET constituting the memory cell is set high and the threshold voltage of each MOSFET constituting a peripheral circuit is reduced (e.g., see Unexamined Patent Publication No. Hei 3(1991)-83289). There has also been proposed an invention wherein in order to reduce power consumption while the speeding-up of read and write operations is being carried out, a source or power supply voltage for each memory cell is set high and the threshold voltage of each MOSFET that constitutes the memory cell, is set high, whereas a power supply voltage for a peripheral circuit is reduced (e.g., see Unexamined Patent Publication No. Hei 10(1998)-242839 (corresponding U.S. Pat. No. 6,046,627), and Unexamined Patent Publication No. Hei 9(1997)-185886 (corresponding U.S. Pat. No. 5,757,702)).

SUMMARY OF THE INVENTION

However, while each of the above references discloses that the threshold voltage of each MOSFET constituting the memory cell and its power supply voltage are set higher than those for the peripheral circuit but does not disclose how to cope with a potential on each word line, a gate size of each MOSFET constituting the memory cell, the thickness of an insulating film, etc. Therefore, the present inventors have found out that improvements in noise margin and read rate and reductions in power consumption and cell area have not yet been achieved sufficiently.

Described specifically, when the threshold voltage of each MOSFET constituting the memory cell is set higher than that for the peripheral circuit as in the invention of the prior application (Unexamined Patent Publication No. Hei 3(1991)-83289), the memory cell cannot be operated at high speed like the peripheral circuit, thereby causing a defective condition that the read rate cannot be made fast. As in the inventions disclosed in Unexamined Patent Publication Nos. Hei 10(1998)-242839 and Hei 9(1997)-185886, the simple increase in the source voltage of each memory cell as compared with that of the peripheral circuit will yield an increase in current consumption of the memory cell, thereby causing an increase in power consumption of the whole chip. Further, when the gate length of each MOSFET constituting the memory cell is made long to enhance a device withstand voltage, an exclusively-possessed area of the memory cell will increase.

An object of the present invention is to provide a technology capable of improving a noise margin and making a read rate fast in a static RAM equipped with memory cells comprising MOSFETs.

Another object of the present invention is to provide a technology capable of effectively reducing power consumption and decreasing an exclusively-possessed area of each of memory cells in a static RAM equipped with the memory cells comprising MOSFETs.

The above, other objects and novel features of the present invention will become apparent from the description of the present specification and the accompanying drawings.

Summaries of typical ones of the inventions disclosed in the present application will be described as follows:

In a semiconductor memory device having a memory array comprising CMOS flip-flop circuit type memory cells, an operating voltage of each memory cell is set higher than an operating voltage of a peripheral circuit, a threshold voltage of each MOS transistor included in the memory cell is set higher than a threshold voltage of each MOS transistor included in the peripheral circuit, a gate insulating film for the MOS transistors included in the memory cell is formed so as to be regarded as thicker than a gate insulating film for the MOS transistors included in the peripheral circuit in the case of conversion to an insulating film of the same material, and a selection level for each word line and a precharge level for each bit line pair are set identical to the level of the operating voltage of the peripheral circuit.

According to the above means, since the operating voltage of the memory cell is high and the threshold voltage of each MOSFET constituting the memory cell is high, a leak current of the memory cell can be reduced and power consumption can be diminished. Further, since the operating voltage of the peripheral circuit is lower than the operating voltage of the memory cell, an operating speed of the peripheral circuit can be made fast, and read and write rates can be enhanced as the whole semiconductor memory device.

Here, preferably, the ratio between a gate width and a gate length of each transmission MOS transistor included in the memory cell is set so as to be identical to or larger than the ratio between a gate width and a gate length of each of N channel MOS transistors included in a first CMOS inverter and a second CMOS inverter. Thus, a current read from each memory cell is increased to allow the read rate to make fast without degrading stability of the memory cell.

Another invention of the present application provides a semiconductor memory device having a memory array comprising CMOS flip-flop circuit type memory cells, wherein an operating voltage of each memory cell and an operating voltage of each of driver circuits for driving each of word lines to a select level are set higher than an operating voltage of a peripheral circuit other than the driver circuits, a threshold voltage of each MOS transistor included in the memory cell is set higher than a threshold voltage of each MOS transistor included in the peripheral circuit other than the driver circuits, a gate insulating film for the MOS transistors included in the memory cell is formed so as to be regarded as thicker than a gate insulating film for the MOS transistors included in the peripheral circuit in the case of conversion to an insulating film of the same material, and a selection level for the word line is set higher than the level of the operating voltage of the peripheral circuit.

According to the above means, since the operating voltage of the memory cell is high and the threshold voltage of each MOSFET constituting the memory cell is high, a leak current of the memory-cell can be reduced and power consumption can be diminished. Further, since the operating voltage of the peripheral circuit is lower than the operating voltage of the memory cell, an operating speed of the peripheral circuit can be made fast, and read and write rates can be enhanced as the whole semiconductor memory device. Since the word-line selection level is high, a read current can be significantly increased although stability of the memory cell is slightly degraded as compared with the invention according to claim 1, and hence the read rate can be made fast.

Here, preferably, the ratio between a gate width and a gate length of each transmission MOS transistor included in the memory cell is set so as to be identical to or smaller than the ratio between a gate width and a gate length of each of N channel MOS transistors included in a first CMOS inverter and a second CMOS inverter. Thus, a static noise margin of each memory cell is increased to make it possible to enhance the stability of the memory cell without lowering the read rate.

DETAILED DESCRIPTION OF THE PREFERRED EMBODIMENTS

Preferred embodiments of the present invention will hereinafter be described with reference to the accompanying drawings.

Figure 1:
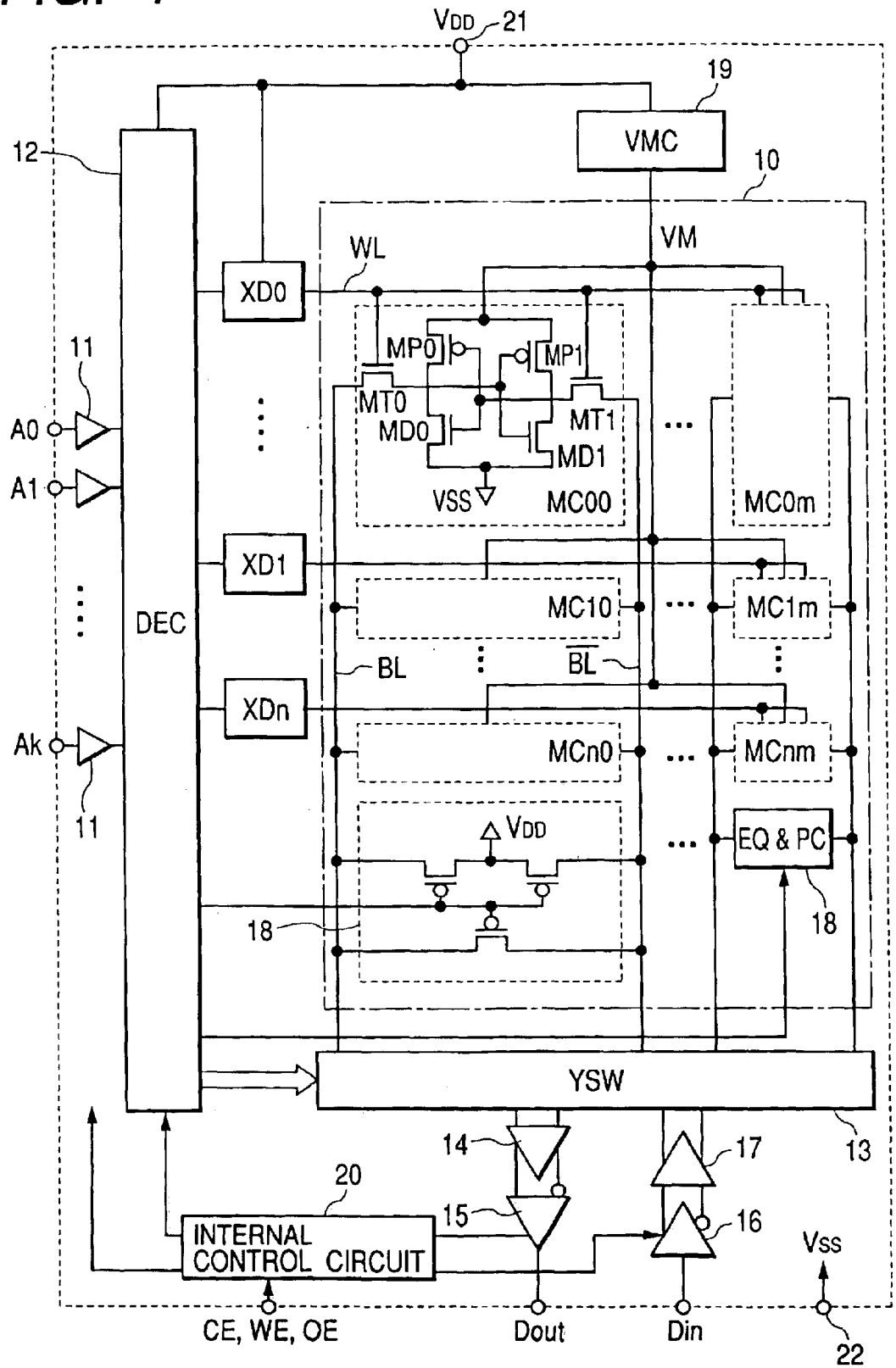
FIG. 1 is a block diagram showing one embodiment of a static RAM suitable for application of the present invention thereto.

FIG. 1 is a schematic configurational diagram showing one embodiment of a static RAM suitable for application of the present invention thereto. In FIG. 1, reference numeral 10 indicates a memory array in which a plurality of flip-flop circuit type memory cells MCs are disposed in a matrix form and having a plurality of word lines WL to which select terminals of the memory cells arranged in the same rows are respectively connected, and a plurality of bit lines BL and /BL to which input/output terminals of the memory cells arranged in the same columns are respectively connected. Reference numerals 11 indicate address buffers which respectively take in or capture input address signals A0 through An. Reference numeral 12 indicates an address decoder which decodes the captured address signals to generate signals for selecting the corresponding word and bit lines in the memory array 10. XD0 through XDn indicate word drivers each of which drives one word line in the memory array 10 to a select level according to the result of decoding of the corresponding address signal in the row system.

Reference numeral 13 indicates a column switch circuit for selecting the corresponding bit lines in the memory array according to the decode signal outputted from the address decoder 12. Reference numeral 14 indicates a sense amplifier circuit for amplifying the difference in potential between the bit lines connected by the column switch circuit 13. Reference numeral 15 indicates a data output buffer for outputting the read data amplified by the sense amplifier circuit 14 to the outside. Reference numeral 16 indicates an input buffer for capturing write data inputted from outside. Reference numeral 17 indicates a write amplifier circuit for supplying a write potential to the corresponding bit lines BL and /BL in the memory array 10 through the column switch 13, based on the captured write data.

In FIG. 1, reference numeral 20 indicates an internal control circuit for supplying predetermined timing signals to peripheral circuits such as the address buffers 11, the address decoder 12, the data output buffer 15, the data input buffer 16, etc., based on a chip enable signal /CE used as a chip select signal, a write enable signal /WE used as a write control signal, an out enable signal /OE used as an output control signal, etc. all of which are supplied from outside. Incidentally, reference numeral 21 indicates a source or power supply terminal supplied with a source or power supply voltage VDD like, for example, 0.6V from the outside, and reference numeral 22 indicates a ground terminal to which a ground potential VSS is applied from outside, respectively. While the sense amplifier circuit 14 and the write amplifier circuit 17 are respectively shown between the data output buffer 15 and the column switch circuit 13 and between the data input buffer 16 and the column switch circuit 13 in the embodiment shown in FIG. 1, they may be provided between the column switch circuit 13 and the memory array 10. The address decoder 12 includes an X (row) address decoder for decoding an X address signal, and a Y (column) address decoder for decoding a Y address signal.

An equalize & precharge circuit (EQ & PC) 18 for short-circuiting between each paired bit lines BL and /BL before reading and precharging the lines to a predetermined potential is provided within the memory array 10. As each memory cell MC, a P-MOS load type memory cell is used which comprises a flip-flop circuit in which an input/output terminal of a first CMOS inverter comprising a P channel MOSFET MP0 and an N channel MOSFET MD0 and an input/output terminal of a second CMOS inverter comprising a P channel MOSFET MP1 and an N channel MOSFET MD1 are cross-connected, and transmission MOSFETs MT0 and MT1 connected between input/output nodes of the flip-flop circuit and their corresponding, pair of bit lines BL and /BL. Incidentally, while the circuit shown in FIG. 1 has shown the embodiment having a terminal for outputting the read data and a terminal for inputting the write data, both of which are provided separately, it may be configured so as to output the read data from a common terminal and input the write data therefrom.

In the first embodiment, a booster or step-up circuit 19 for boosting the source or power supply voltage VDD like 0.6V supplied to the power supply terminal 21 from outside and generating a boost voltage VM like, e.g., 1.2V is provided. Along with it, the boost voltage VM generated by the step-up circuit 19 is applied to a source or power-supply voltage terminal of the memory array 10, i.e., source terminals of P-MOSs MP0 and MP1 of each memory cell MC as an operating voltage. Incidentally, a ground potential VSS is applied to source terminals of N-MOSs MD0 and MD1 of each memory cell MC.

On the other hand, the external power supply voltage VDD is applied to source or power-supply voltage terminals of peripheral circuits such as the address decoder 12 and word drivers XD0 through XDn except for the memory array 10 as an operating voltage. Except for at standby, i.e., upon read and write, all the word lines WL in the memory array 10 are respectively brought to a low level like the ground potential VSS so that the transmission MOSFETs MT0 and MT1 of each memory cell MC are turned off. Upon read or write, one word line WL in the memory array 10 is brought to a high level like the power supply voltage VDD so that the transmission MOSFETs MT0 and MT1 of each memory cell MC are turned on, whereby the corresponding memory cell MC is brought to a state of being able to read or write memory information. Further, a level for precharging each of the bit lines BL and /BL is set to the same VDD as the power supply voltage used for the peripheral circuits.

Further, in the first embodiment, MOSFETs MT0 and MT1; MP0 and MP1; and MD0 and MD1 that constitute each memory cell MC, have such structures and characteristics as described below.

Firstly, a gate insulating film for the MOSFETs MT0 and MT1; MP0 and MP1; and MD0 and MD1 that constitute each memory cell MC, is formed so as to become thicker than that for MOSFETs that constitute the peripheral circuits such as the decoder circuit 12. Thus, even if the boost voltage VM is applied to its corresponding source terminals of the P-MOSs MP0 and MP1, such a withstand voltage as not to degrade the gate insulating film is given thereto.

Secondly, threshold voltages of the MOSFETs MT0 and MT1; MP0 and MP1; and MD0 and MD1 that constitute each memory cell MC, are set higher than those of the MOSFETs that constitute the peripheral circuit. While the threshold voltages are also set high by making thick the gate insulating film, the impurity concentrations of channel sections are made different by the MOSFETs of the memory cells and the MOSFETs of the peripheral circuits to thereby change the threshold voltages in the present embodiment. Described specifically, each of the threshold voltages of the MOSFETs MT0 and MT1; MP0 ad MP1; and MD0 and MD1 that constitute each memory cell MC, is set to about 0.5V, whereas each of the threshold voltages of the MOSFETs that constitute the peripheral circuit, is set to about 0.3V.

A third characteristic of the MOSFETs MT0 and MT1; MP0 and MP1; and MD0 and MD1 that constitute each memory cell MC in the first embodiment resides in that when W/L (ratios between gate widths W and gate lengths L) of the respective MOSFETs are represented as WT/LT, WP/LP and WD/LD respectively, WT/LT and WD/LD are set so as to satisfy WT/L≧WD/LD. In the conventional general SRAM in which the power supply voltage for each memory cell and the power supply voltage for each peripheral circuit are the same, the transmission MOSFETs MT0 and MT1 are designed so as to increase in impedance as WT/LT<WD/LD in most cases in order to enhance stability (static noise margin) of each memory cell, i.e., avoid the inversion of retention information under the influence of a potential from a bit line in its information holding state. However, the present embodiment achieves an improvement in read rate by establishing WT/LT≧WD/LD in reverse to the conventional example, without impairing the stability of each memory cell.

Incidentally, although not restricted in particular, WT/LT>WP/LP has been established to enhance a write characteristic in regard to the transmission MOSFETs MT0 and MT1 and load MOSFETs MP0 and MP1 that constitute each memory cell MC. A description will be made below of the reason why the read rate is made fast under WT/LT≧WD/LD without impairing stability of each memory cell.

Figure 2:
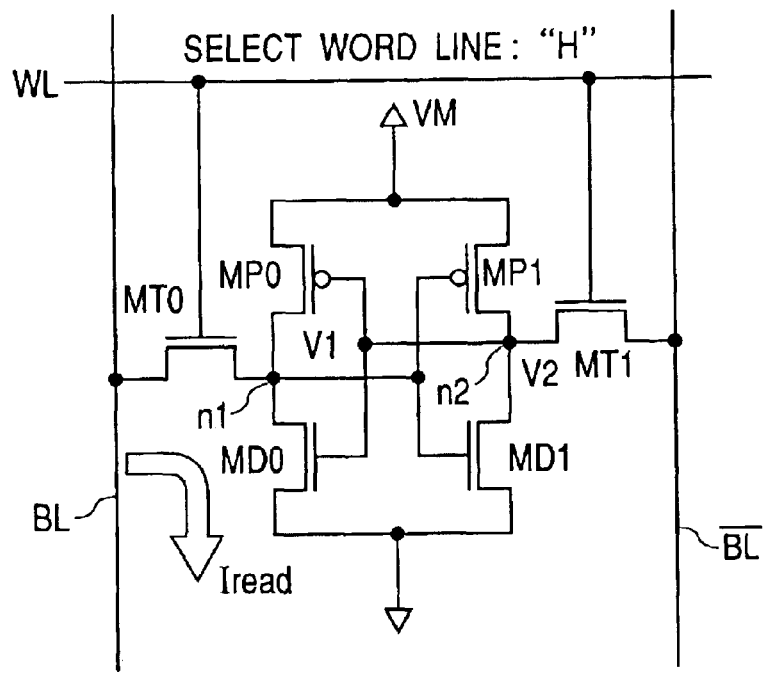
FIG. 2 is a circuit diagram illustrating an example of a configuration of a memory cell.

One memory cell MC1 connected to its corresponding bit line pair BL and /BL that constitutes the memory array, is shown in FIG. 2 in a taken-out form. Now consider where a word line WL1 connected with the memory cell MC1 is brought to a select level (VDD), and a potential V1 at an input/output node n1 on the left side of the drawing is lower than a potential V2 at an input/output node n2 on the right side in the memory cell MC1. In doing so, transmission MOSFETs MT0 and MT1 are turned on in the memory cell MC1 so that such a read current Iread as shown in FIG. 2 by way of example flows.

Figure 3:
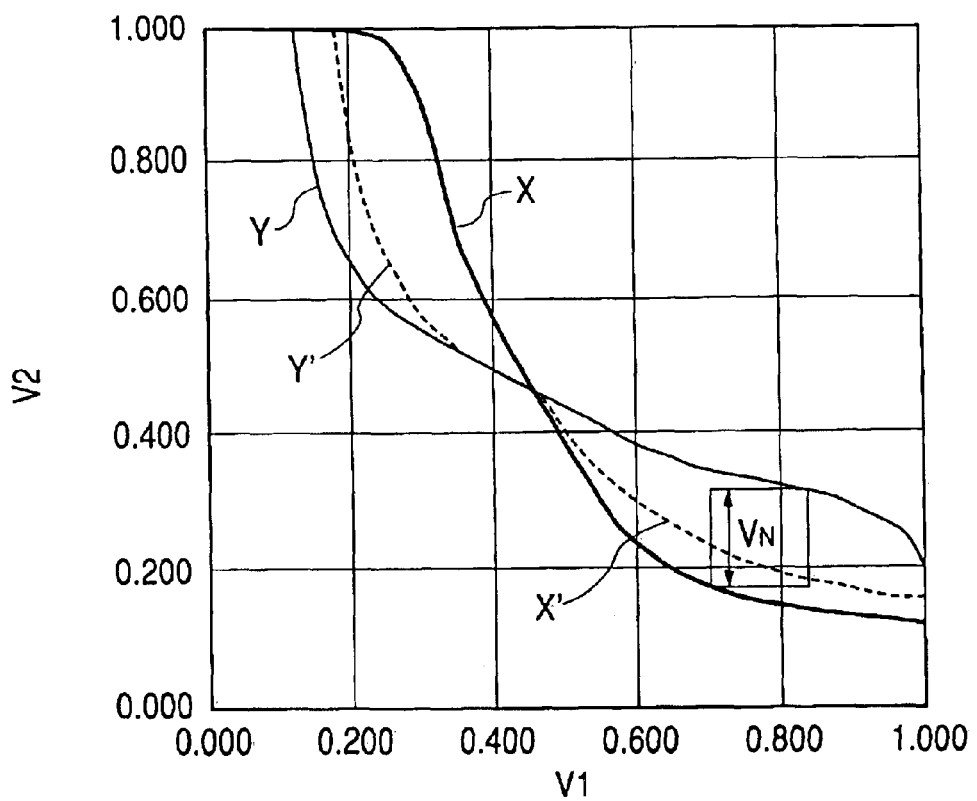
FIG. 3 is a graph showing input/output characteristics of two inverters that constitute a memory cell.

Since each MOSFET is large in gate width but reduced in on resistance, the larger the gate widths of the transmission MOSFETs MT0 and MT1 even in the case of the memory cell shown in FIG. 2, the greater the read current Iread. Therefore, the read rate becomes fast. However, the read current Iread increases when the gate widths of the transmission MOSFETs MT0 and MT1 are large, so that the potential V1 rises and hence a static noise margin SNM becomes small. Here, the static noise margin SNM can be defined as one side VN of the largest square drawable within an area surrounded by two characteristic curves X and Y in FIG. 3 showing input/output characteristics of two inverters that constitute the memory cell. The static noise margin becomes high as the value increases, so that the stability of the memory cell is enhanced.

Incidentally, the curve X and the curve Y in FIG. 3 respectively show an output characteristic of the potential V12 at the node n2 when the potential V1 at the node n1 of the memory cell is defined as an input, and an output characteristic of the potential V1 at the node n1 when the potential V2 at the node n2 of the memory cell is defined as an input. It is understood that when the transmission MOSFETs MT0 and MT1 increases in gate width, they decrease in impedance, so that the respective characteristic curves X and Y are brought to broken lines X' and Y' to thereby reduce the value VN indicative of the static noise margin.

Figure 4:
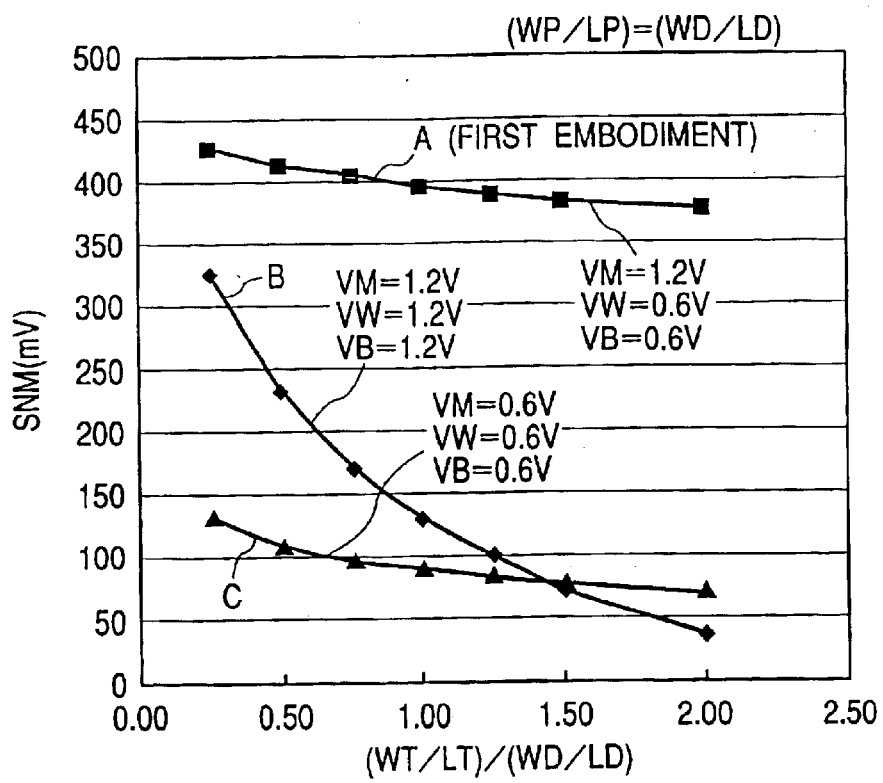
FIG. 4 is a graph illustrating the relationship between ratios (WT/LT)/(WD/LD) between respective gate widths W and gate lengths L of a transmission MOSFET MT0 (MT1) and an N-MOS MD0 (MD1), and a static noise margin SNM.
Figure 5:
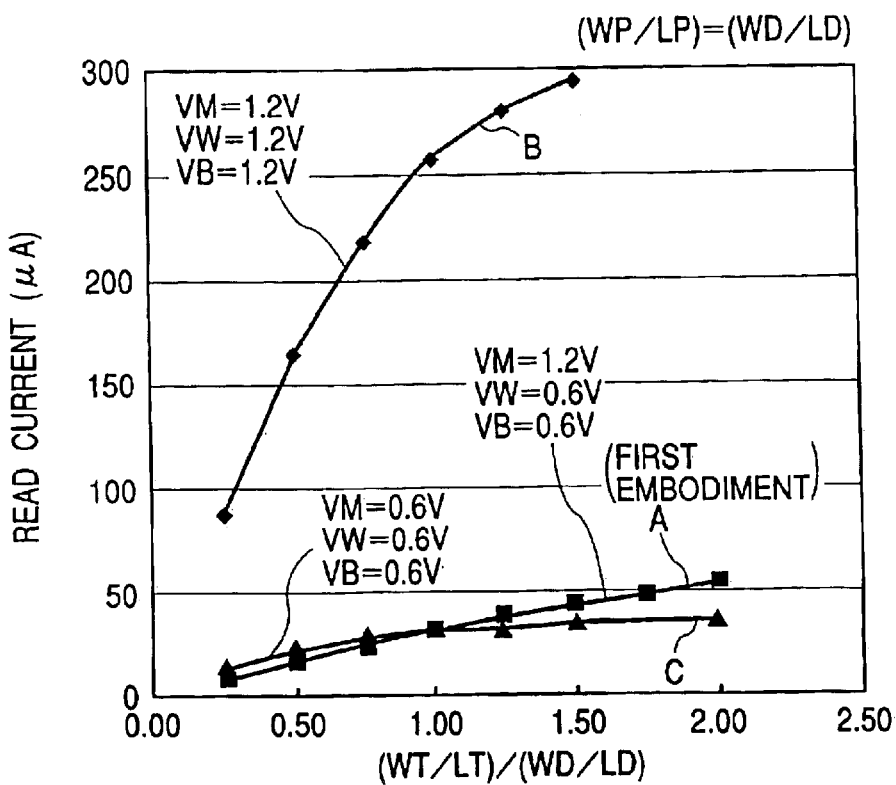
FIG. 5 is a graph showing the relationship between ratios (WT/LT)/(WD/LD) between the respective gate widths W and gate lengths L of the transmission MOSFET MT0 (MT1) and N-MOS MD (MD1), and a read current Iread.

Next, the relationship between ratios WT/LT and WD/LD of gate widths W and gate lengths L of the transmission MOSFET MT0 (MT1) and N-MOS MD0 (MD1), and a static noise margin SNM is shown in FIG. 4, whereas the relationship between WT/LT and WD/LD and a read current Iread is shown in FIG. 5. FIGS. 4 and 5 respectively show ratios (WT/LT)/(WD/LD) between W/L of the transmission MOSFET MT0 (MT1) and W/L of the N-MOS MD0 (MD1) as horizontal axes. Incidentally, ratios WP/LP and WD/LD of gate widths W and gate lengths L of a load P-MOS MP0 (MP1) and a load N-MOS MD0 (MD1) are set equal to each other (WP/LP=WD/LD) here.

In FIGS. 4 and 5, a line A formed by connecting ■ marks shows the relationship between (WT/LT)/(WD/LD) and the static noise margin SNM in the present embodiment wherein the source or power supply voltage VM of the memory cell is set as 1.2V, a selection level VW for each word line is set as 0.6V and a precharge level VB for each bit line pair is set as 0.6V, a line B formed by connecting ♦ marks shows the relationship between (WT/LT)/(WD/LD) and the static noise margin SNM when the power supply voltage VM for the memory cell is set as 1.2V, the word-line selection level VW is set as 1.2V, and the bit-line precharge level VB is set as 1.2V, and a line C formed by connecting ▲ marks shows the relationship between (WT/LT)/(WD/LD) and the static noise margin SNM when the power supply voltage VM for the memory cell is set as 0.6V, the word-line selection level VW is set as 0.6V, and the bit-line precharge level VB is set as 0.6V, respectively.

It is understood from FIG. 4 that when the source voltage VM for the memory cell is set as 1.2V, the selection level VW for the word line is set as 0.6V and the precharge level VB for the bit line pair is set as 0.6V as in the present embodiment, the static noise margin SNM becomes small as the ratio (WT/LT)/(WD/LD) between W/L of the transmission MOSFET MT0 (MT1) and W/L of the N-MOS MD0 (MD1) increases but the rate of its decrease is relatively low, and when (WT/LT)/(WD/LD) falls in all the ranges greater than or equal to 0.25, the static noise margin SNM becomes satisfactory as compared with the case in which VW and VB are respectively set to 1.2V or 0.6V identical to VM.

On the other hand, it is understood from FIG. 5 that a read current Iread is of the largest where VW and VB are respectively set to 1.2V identical to VM, whereas when (WT/LT)/(WD/LD) is greater than or "1", the read current Iread in the present embodiment becomes large as compared with the case where VW and VB are respectively set to 0.6V identical to VM. Thus, when the source voltage VM for the memory cell is set to 1.2V, the selection level VW for the word line is set to 0.6V and the precharge level VB for each bit line pair is set to 0.6V, and the ratio (WT/LT)/(WD/LD) between W/L of the transmission MOSFET MT0 (MT1) and W/L of the N-MOS MD0 (MD1) is set to greater than or equal to "1", this becomes effective in designing an SRAM which has put emphasis on the static noise margin, i.e., stability rather than the read rate.

However, the above condition corresponds to the case in which all of the MOSFETs that constitute each memory cell, are made higher than the MOSFETs of the peripheral circuits in threshold voltage, and the gate insulating film is made thick. As a modification of the first embodiment, there is now considered a configuration wherein the gate insulating film for the transmission MOSFETs MT0 and MT1 of the MOSFETs constituting each memory cell is formed as a thin insulating film identical to one for the MOSFETs of the peripheral circuit (and however their threshold voltages are set high). This is because no boost voltage is directly applied to the transmission MOSFETs MT0 and MT1, the amplitude of each gate voltage ranges from 0V to 0.6V, and there is no need to increase a withstand voltage as in the load MOSFETs MP0 and MP1.

Thus, when the gate insulating film for the transmission MOSFETs MT0 and MT1 is thinned, they are susceptible to an electric field developed by the gate voltage as compared with the case in which it is made thick. If the gate width of each MOSFET MT is not reduced, it is then held on so that the potential at the bit line pair is apt to influence the input/output nodes n1 and n2 within the memory cell. Namely, the stability of the memory cell is degraded. Thus, preferably, the ratio (WT/LT)/(WD/LD) between W/L of the transmission MOSFET MT0 (MT1) and W/L of the N-MOS MD0 (MD1) is less than or equal to "1", i.e., WT/LT is set smaller than WD/LD.

Figure 6:
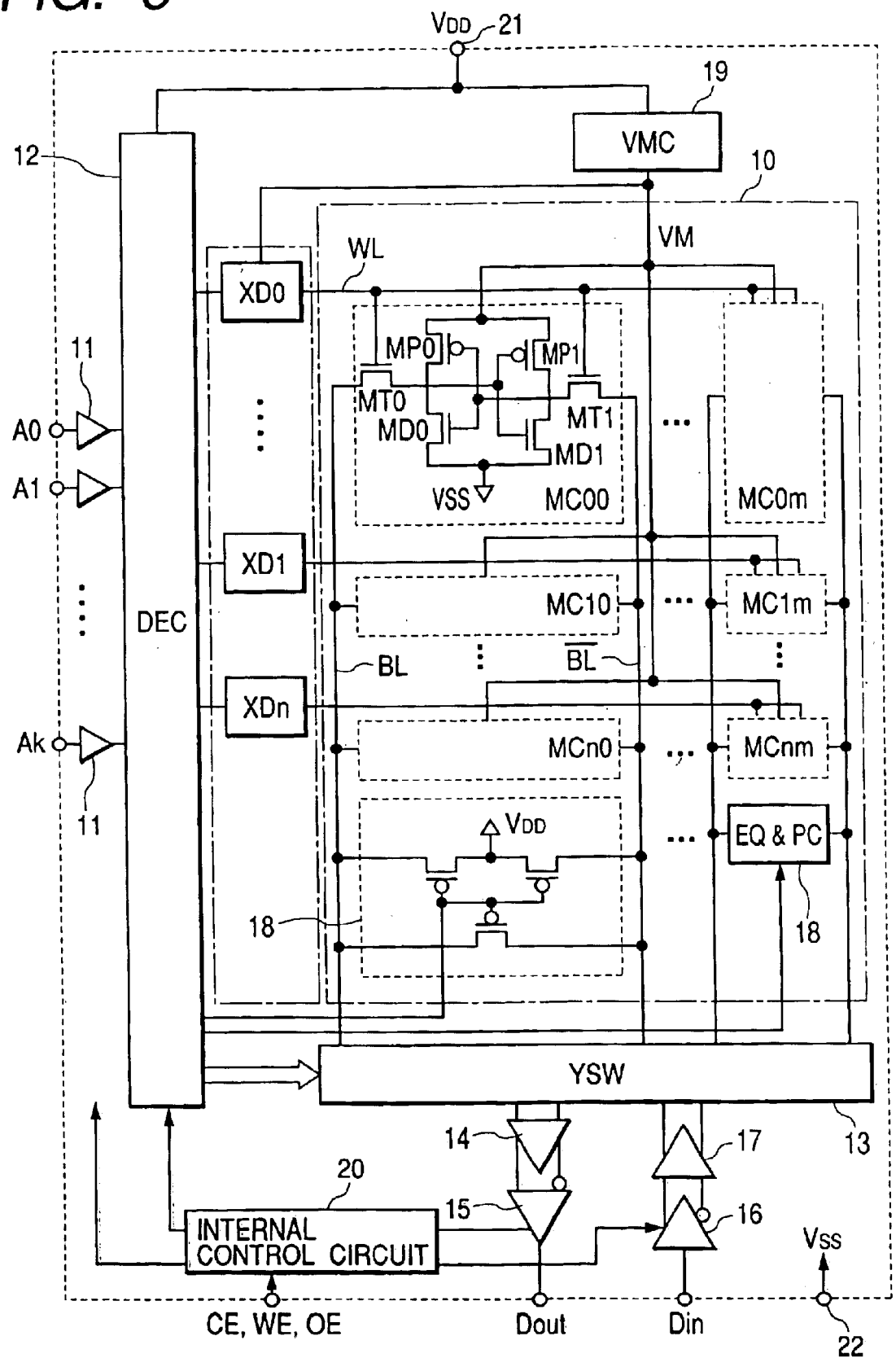
FIG. 6 is a schematic configurational diagram illustrating a second embodiment of a static RAM to which the present invention is applied.

FIG. 6 is a schematic configurational diagram showing a second embodiment of a static RAM to which the present invention is applied. The difference in circuitry between the first embodiment and the second embodiment resides in that the power supply voltage for the peripheral circuits except for the memory array is set as VDD in the first embodiment, whereas in the second embodiment, a power supply voltage for each of word drivers XD0 through XDn of peripheral circuits is set as a voltage VM obtained by boosting it with a booster or step-up circuit 19. Namely, the selection level for each word line WL is set as VDD (0.6V) in the first embodiment, whereas the selection level for each word line WL is set as a potential (e.g., VM (1.2V)) higher than VDD (0.6V) in the second embodiment. While the precharge level for bit lines BL and /BL is normally set to the same level as the selection level for the word line WL, the precharge level is set to a potential (e.g., VDD (0.6V)) lower than the selection for the word line WL in the second embodiment. In the second embodiment, threshold voltages of MOSFETs MT0 and MT1; MP0 and MP1; and MD0 and MD1 that constitute each memory cell MC, are set higher than those of the MOSFETs constituting the peripheral circuits in a manner similar to the first embodiment.

Further, gate insulating films for the MOSFETs MT0, MT1; MP0 and MP1; and MD0 and MD1 constituting the memory cell MC, and high voltage-applied MOSFETs (P-MOSs) of MOSFETs constituting the word drivers XD0 through XDn are formed so as to become thicker than a gate insulating film for MOSFETs constituting other peripheral circuits such as a decoder circuit 12 in the second embodiment. Thus, even if the boost voltage VM is applied to source terminals of these MOSFETs, such a withstand voltage as not to degrade the gate insulating film is given.

Figure 7:
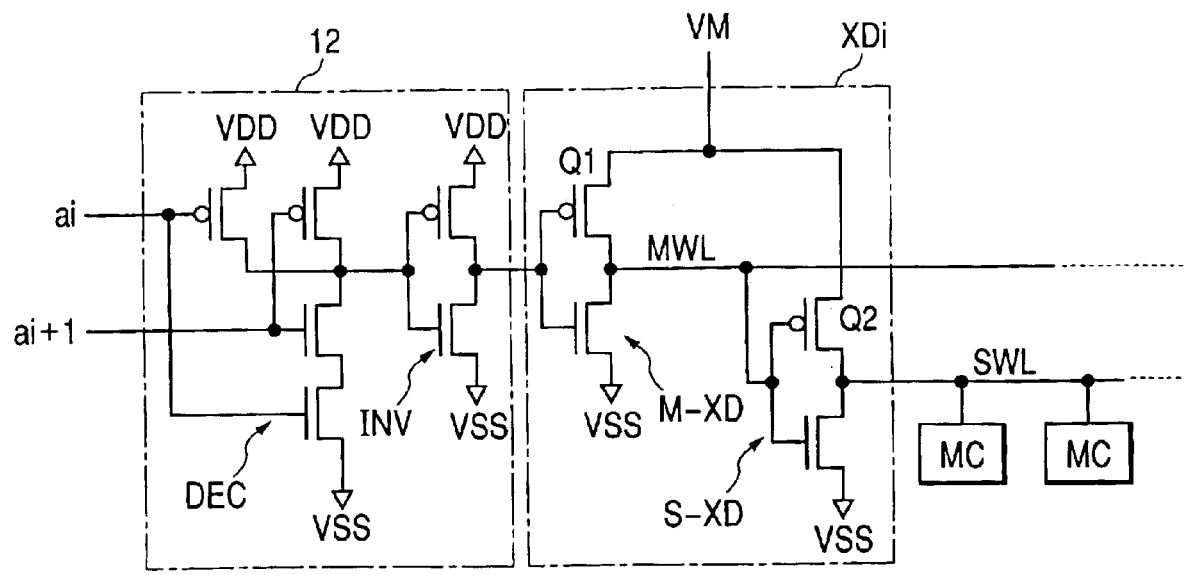
FIG. 7 is a circuit diagram depicting a specific example illustrative of a decoder circuit and a word driver.

FIG. 7 shows parts of the decoder circuit 12 and the word drivers XD0 through XDn. DEC indicates a unit decoder comprising NAND gates with internal address signals ai and ai+1 as input signals, and INV indicates an inverter for inverting an output thereof. Although not restricted in particular in the second embodiment, word lines are respectively formed as hierarchical configurations each of which comprises a main word line MWL and a plurality of sub word lines SWL, and memory cells MCs are connected to the sub word line SWL. M-XD indicates a main word driver for driving the main word line MWL, and S-XD indicates a sub word driver for driving the corresponding sub word line SWL in response to a potential applied to the main word line MWL. In the present embodiment, a gate insulating film for a P channel MOSFT Q1 constituting the main word driver M-XD and a P channel MOSFET Q2 constituting the sub word driver S-XD is formed so as to be thicker than the gate insulating film for the MOSFETs constituting other peripheral circuits such as the decoder circuit 12.

Further, W/L (ratios between gate widths W and gate lengths L) of MOSFETs MT0 and MT1; MP0 and MP1 and MD0 and MD1 that constitute each memory cell MC, are respectively set as WT/LT, WP/LP and WD/LD. In doing so, WT/LT≧WD/LD is established in the first embodiment, whereas WT/LT≦WD/LD is established in the second embodiment to thereby enhance the stability of the memory cell. A description will be made below of the reason why the stability of each memory cell is improved by establishing WT/LT≦WD/LD.

Figure 8:
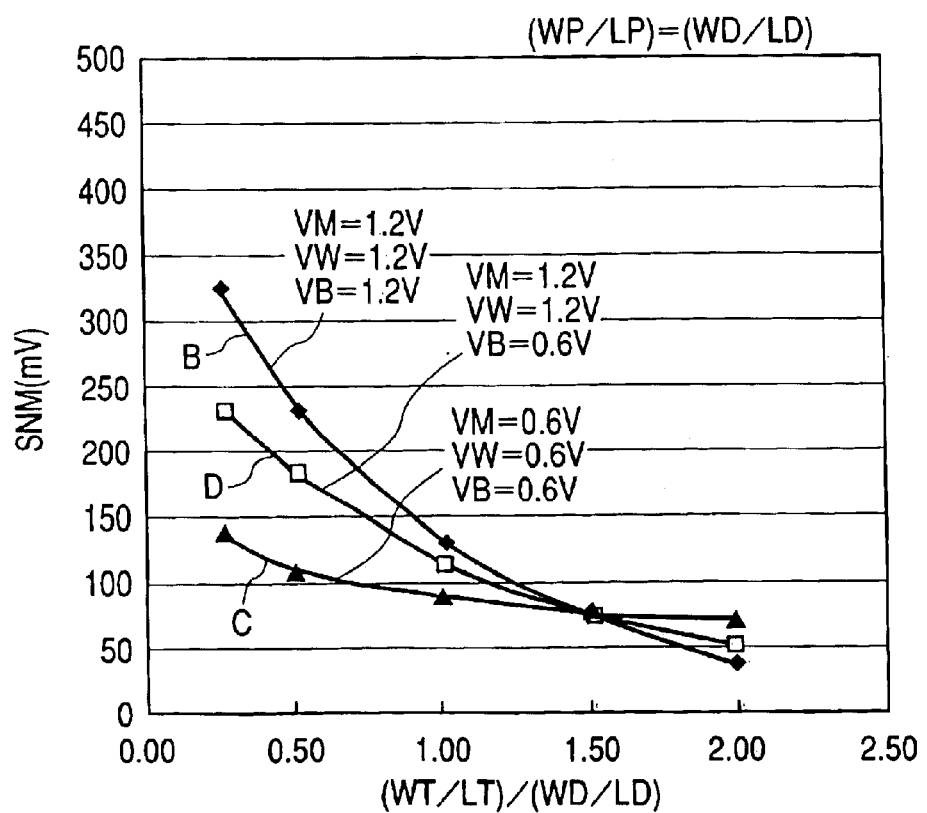
FIG. 8 is a graph showing the relationship between ratios (WT/LT)/(WD/LD) between respective gate widths W and gate lengths L of a transmission MOSFET, MT0 (MT1) and an N-MOS MD0 (MD1), and a static noise margin SNM.

FIG. 8 shows the relationship between ratios WT/LT and WD/LD between gate widths W and gate lengths L of a transmission MOSFET MT0 (MT1) and an N-MOS MD0 (MD1), and a static noise margin SNM. FIG. 8 shows a ratio (WT/LT)/(WD/LD) between W/L of the transmission MOSFET MT0 (MT1) and W/L of the N-MOS MD0 (MD1) as a horizontal axis. Incidentally, ratios WP/LP and WD/LD of gate widths W and gate lengths L of a load, P-MOS MP0 (MP1) and a load N-MOS MD0 (MD1) are set equal to each other (WP/LP=WD/LD) here.

In FIG. 8, a line D formed by connecting □ marks shows the relationship between (WT/LT)/(WD/LD) and the static noise margin SNM in the present embodiment in which the source or power supply voltage VM of the memory cell is set as 1.2V, a selection level VW for each word line is set as 1.2V and a precharge level VB for each bit line pair is set as 0.6V, a line B formed by connecting ♦ marks shows the relationship between (WT/LT)/(WD/LD) and the static noise margin SNM when the power supply voltage VM for the memory cell is set as 1.2V, the word-line selection level VW is set as 1.2V, and the bit-line precharge level VB is set as 1.2V, and a line C formed by connecting ▲ marks shows the relationship between (WT/LT)/(WD/LD) and the static noise margin SNM when the power supply voltage VM for the memory cell is set as 0.6V, the word-line selection level VW is set as 0.6V, and the bit-line precharge level VB is set as 0.6V, respectively.

The static noise margin SNM has needed to have greater than about 200 mV when the source voltage WM for each memory cell is set to 1.2V, the selection level VW for each word line is set to 1.2V and the precharge level VB for each bit line pair is set to 1.2V as in the conventional SRAM. Thus, (WT/LT)/(WD/LD) needs to be 0.7 or less in this case as is understood from a characteristic curve B shown in FIG. 8. On the other hand, let's now assume that when the SRAM is scaled down according to a scaling law and brought to a low source voltage, and VDD is set to 0.6V, it is designed so that noise is reduced in proportion to it. In this case, the lower limit of the static nose margin SNM in each memory cell results in about 100 mV. Thus, (WT/LT)/(WD/LD) needs to reach 0.6 or less as is understood from a characteristic curve C shown in FIG. 8.

Assuming, on the other hand, that the SRAM is designed so that the power supply voltage VDD reaches 0.6V and noise is also reduced in proportion to it where the second embodiment is applied, the lower limit of the static noise margin SNM in each memory cell is about 100 mV. It is therefore understood that (WT/LT)/(WD/LD) may be 1.2 or less, i.e., WT/LT≦WD/LD as is understood from a characteristic curve D shown in FIG. 8. Assuming that as (WT/LT)/(WD/LD) decreases, the transmission MOSFETs MT0 and MT1 must be made small-sized, and when the transmission MOSFETs are set to a minimum size determined by a process, drive N-MOSs MD0 and MD1 and loads P-MOSs must be increased according to the inverse of (WT/LT)/(WD/LD) referred to above. Therefore, the area of each memory cell will increase. Thus, since the value of (WT/LT)/(WD/LD) may simply be set to 1 or a value slightly smaller than it, i.e., the sizes of the transmission MOSFETs and the drive N-MOSs can be made substantially identical to one anther in the second embodiment, the area of the memory cell can be reduced.

Figure 9:
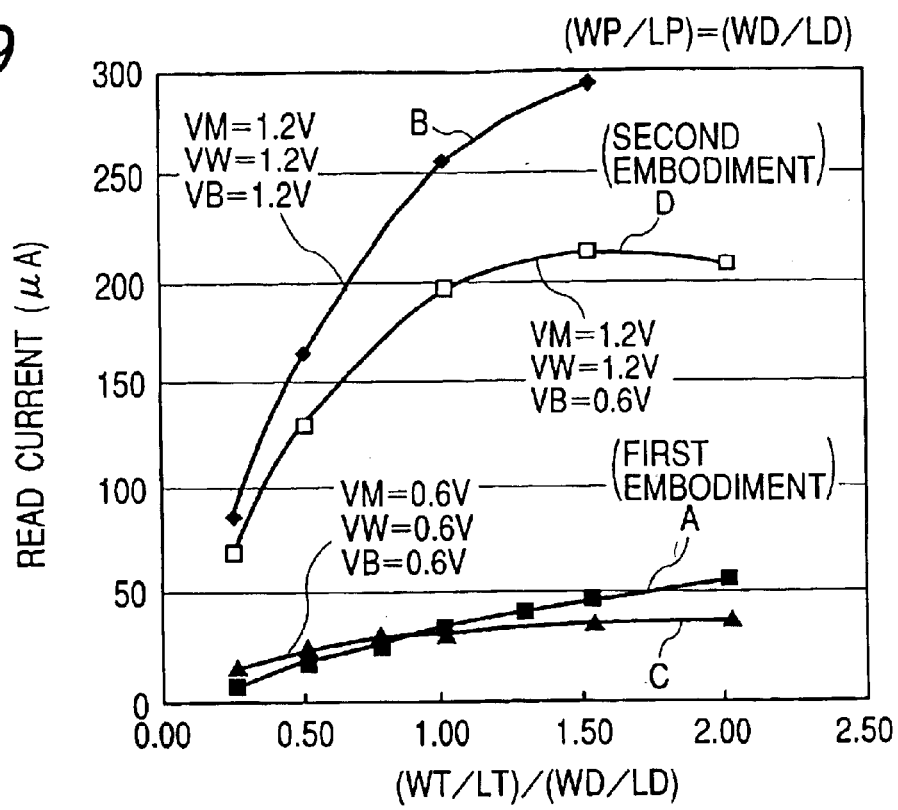
FIG. 9 is a graph illustrating the relationship between ratios (WT/LT)/(WD/LD) between the respective gate widths W and gate lengths L of the transmission MOSFET MT0 (MT1) and N-MOS MD0 (MD1), and a read current Iread.

Further, when a read current Iread in the second embodiment is plotted according to (WT/LT)/(WD/LD), the read current is represented like □ marks in FIG. 9. Thus, the relationship between the read current Iread and (WT/LT)/(WD/LD) results in a characteristic curve D obtained by connecting the □ marks. Incidentally, other characteristic curves A through C in FIG. 9 are ones showing ones of FIG. 5 described in the first embodiment, as they are. It is understood that when the characteristic curve A of the first embodiment and the characteristic curve D of the second embodiment are compared with each other, the second embodiment is capable of increasing the read current by far as compared with the first embodiment, and hence a read rate can be made fast. However, it is understood that as is apparent from the comparison between the characteristic curve A shown in FIG. 4 and the characteristic curve D shown in FIG. 8, the first embodiment is larger in static noise margin than the second embodiment, and the stability of the memory cell can be enhanced.

Incidentally, the relationship between the sizes of the load P-MOSs MP0 and MP1 and transmission MOSFETs MT0and MOSFETs MT0 and MT1 constituting each memory cell MC also presents a problem in order to reduce the area of the memory cell. Thus, a description will next be made of the relationship between the sizes of the load P-MOSs MP0 and MP1 and the sizes of the transmission MOSFETs MT0 and MT1.

Figure 10:
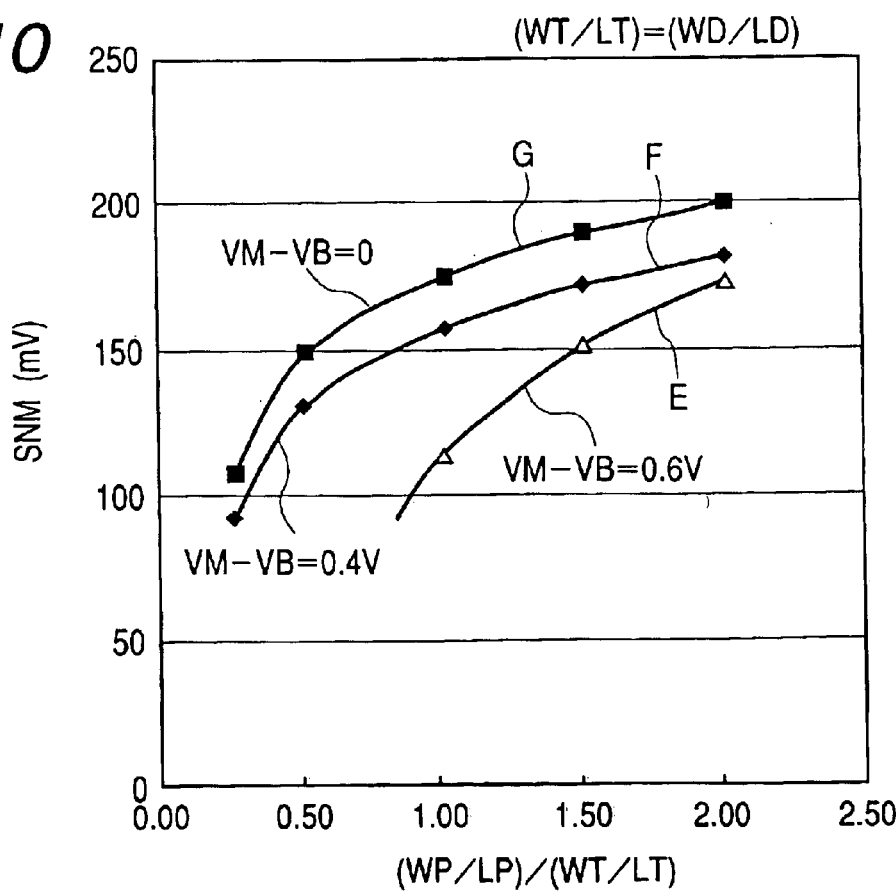
FIG. 10 is a graph depicting the relationship between ratios (WP/LP)/(WT/LT) between respective gate widths W and gate lengths L of a load P-MOS MP0 (MP1) and a transmission MOSFET MT0 (MT1), and a static noise margin SNM.

FIG. 10 shows the relationship between ratios WP/LP and WT/LT of gate widths W and gate lengths L of the load P-MOS MP0 (MP1) and the transmission MOSFET MT0 (MT1) and a static noise margin SNM. FIG. 10 illustrates a ratio (WP/LP)/(WT/LT) between W/L of the load P-MOS MP0 (MP1) and W/L of the transmission MOSFET MT0 (MT1) as a horizontal axis. Incidentally, the ratios WT/LT and WD/LD of the gate widths W and the gate lengths L of the transmission MOSFET MT0 (MT1) and the drive N-MOS MD0 (MD1) are set equal to each other (WT/LT=WD/LD) here. Threshold voltages of the respective MOSFETs that constitute each memory cell, were set to 0.5V.

Referring to FIG. 10, a line E obtained by connecting Δ marks shows the relationship between (WP/LP)/(WT/LT) and the static noise margin SNM in the present embodiment in which the power supply voltage VM for each memory cell is 1.2V, the selection level VW for each word line is 1.2V and the precharge level VB for each bit line pair is 0.6V, i.e., the difference between the bit-line precharge level and the power supply voltage VM for each memory cell is 0.6V.

It is understood from FIG. 10 that (WP/LP)/(WT/LT) may be set to greater than or equal to 0.9 in order to ensure the static noise margin SNM as 100 mV or higher. Namely, the transmission MOSFETs and load P-MOSs can be made substantially identical to one another in size. As described above; the transmission MOSFETs and drive N-MOSs can also be made substantially identical to one another in size in the second embodiment. Therefore, the sizes of the transmission MOSFETs, load P-MOSs and drive N-MOSs can be designed to the minimum sizes determined according to the process in the second embodiment. Thus, the area of each memory cell is minimized so that high integration can be achieved.

The above description has been made of the embodiment in which the power supply voltage for each memory cell is set as the step-up voltage VM higher than the power supply voltage VDD for the peripheral circuits, the word-line selection level is set to the potential (boost or step-up voltage VM) higher than the power supply voltage VDD, and the bit-line precharge level is set to the power supply voltage VDD lower than the word-line selection level. As a modification of the second embodiment here, there is considered a configuration wherein the bit-line precharge level is set lower than VM for the word-line selection level but higher than the power supply voltage VDD.

In this case, the threshold voltages of the transmission MOSFETs MT0 and MT1 are placed in relation to one another. In the case of the second embodiment in which the word-line selection level is higher than the voltage obtained by adding the threshold voltage (e.g., 0.5V) for each of MT0 and MT1 to the bit-line precharge level (e.g., 0.6V), there is a possibility that since the current flows in the load P-MOSs MP0 and MP1 in each memory cell upon reading in which the transmission MOSFETs MT0 and MT1 are turned on, it influences the potential on each bit line so that the stability of other memory cells will be impaired. However, when the word-line selection level is lower than the voltage obtained by adding the threshold voltage (e.g., 0.5V) for each of MT0 and MT1 to the bit-line precharge level (e.g., 0.6V), no current flows in the load P-MOSs MP0 and MP1 upon reading in which the transmission MOSFETs MT0 and MT1 are turned on.

Namely, if no current flows in the load P-MOSs MP0 and MP1, then no problem arises if the stability of each memory cell is ensured even if the load P-MOSs MP0 and MP1 are reduced in size. The relationships between (WP/LP)/(WT/LT) and static noise margins SNM where the bit-line precharge level VB is set to the same level as VM corresponding to the selection level for each word line WL, and it is set to the level lower than the selection level VM for the word line WL by 0.4V, are respectively shown in FIG. 10.

Namely, a line F formed by connecting ♦ marks shows the relationship between (WP/LP)/(WT/LT) and a static noise margin SNM when the bit-line precharge level VB is set to 0.8V, i.e., the difference between the bit-line precharge level and VM corresponding to the selection level for each word line WL is set to 0.4V, and a line G formed by connecting ■ marks shows the relationship between (WP/LP)/(WT/LT) and a static noise margin SNM when the bit-line precharge level VB is set to 1.2V, i.e., the difference between the bit-line precharge level and VM corresponding to the selection level for the word line WL is set to 0V, are respectively shown in FIG. 10. A line E formed by connecting Δ marks shows the relationship between (WP/LP)/(WT/LT) and a static noise margin SNM in the second embodiment in which the bit-line precharge level VB is set to 0.6V, i.e., the difference between the bit-line precharge level and the power supply voltage VM for each memory cell is set to 0.6V.

It is understood from the curves F and G shown in FIG. 10 that when the difference between the bit-line precharge level and VM corresponding to the selection level for the word line WL is set to 0.4V or 0V, 100 mV can be ensured as the static noise margin SNM even if (WP/LP)/(WT/LT) is set to 0.4 to 0.9. Thus, if in such a layout that the exclusively-possessed area of each memory cell depends on the sizes of the load P-MOSs MP0 and MP1, the respective levels are set such that the word-like selection level VW becomes lower than a voltage obtained by adding the threshold voltage of each of the transmission MOSFETs MT0 and MT1 to the bit-line precharge level VB, or the bit-line precharge level VB becomes higher than a voltage obtained by subtracting the threshold voltage of each of the transmission MOSFETs MT0 and MT1 from the word-line selection level VW in reverse, (WP/LP)/(WT/LT) can be set to less than or equal to "1" and hence the exclusively-possessed area of each memory cell can be reduced.

Figure 11:
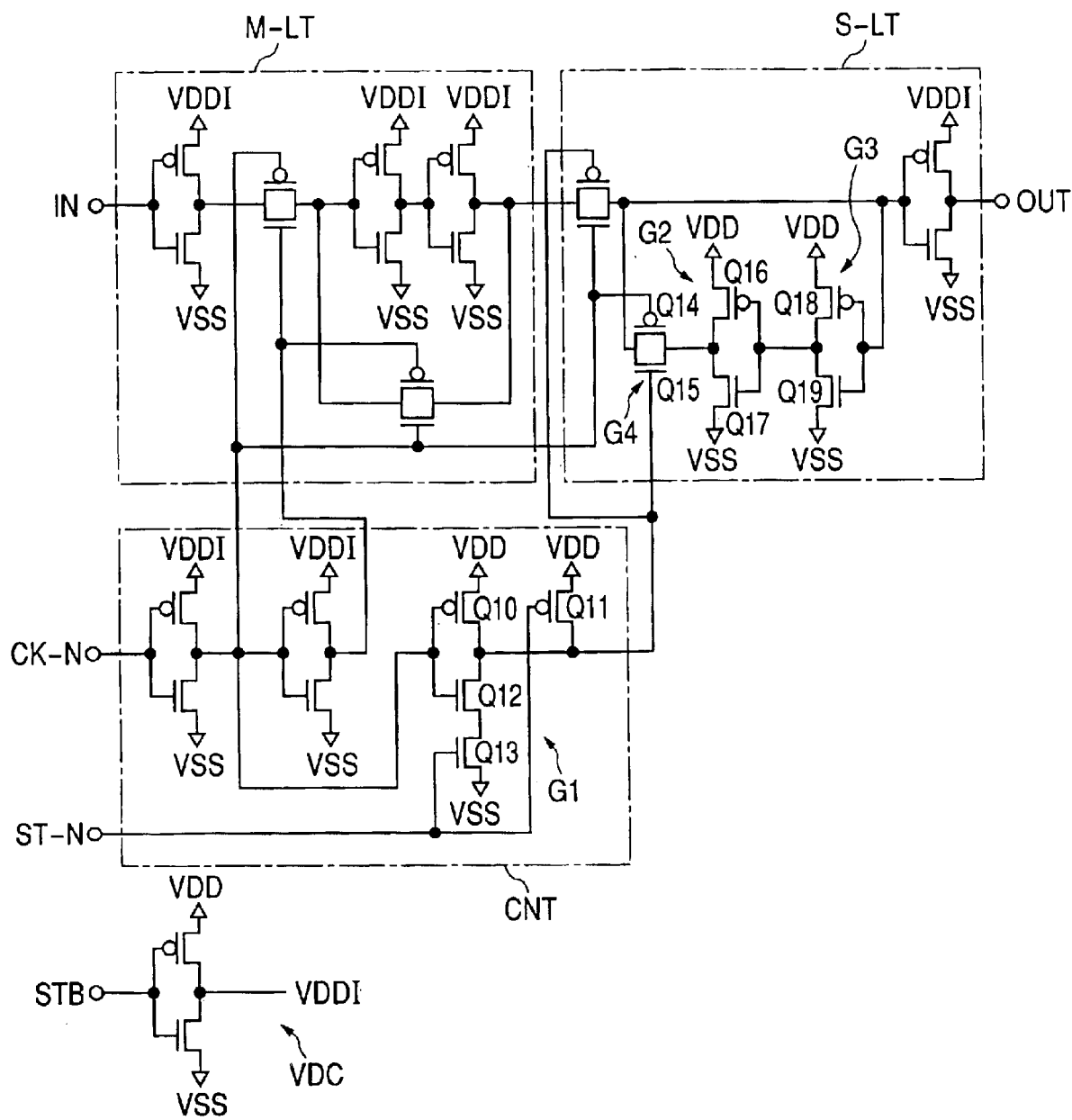
FIG. 11 is a circuit diagram showing a specific example of a flip-flop circuit included in a peripheral circuit.

A third embodiment of the present invention will next be described using FIG. 11. The third embodiment is an embodiment in which a peripheral circuit of an SRAM builds a flip-flop circuit therein. A specific example of the flip-flop circuit is shown in FIG. 11. As such a flip-flop circuit, there is considered a circuit which latches an address signal and a data signal therein in a clock synchronous SRAM, for example. In the present embodiment, source or power supply voltages for some circuits in the flip-flop circuit are switched upon standby other than upon read or write to make it possible to reduce power consumption, and MOSFETs (corresponding to MOSFETs whose symbolic gate portions are indicated by thick lines in FIG. 11) of some of circuit portions in the flip-flop circuit, in which no power supply voltages are switched at standby, are configured as elements (corresponding to elements high in threshold voltage and thick in gate insulating film) each having the same structure as the MOSFETs that constitute each memory cell in the above embodiment.

Figure 12:
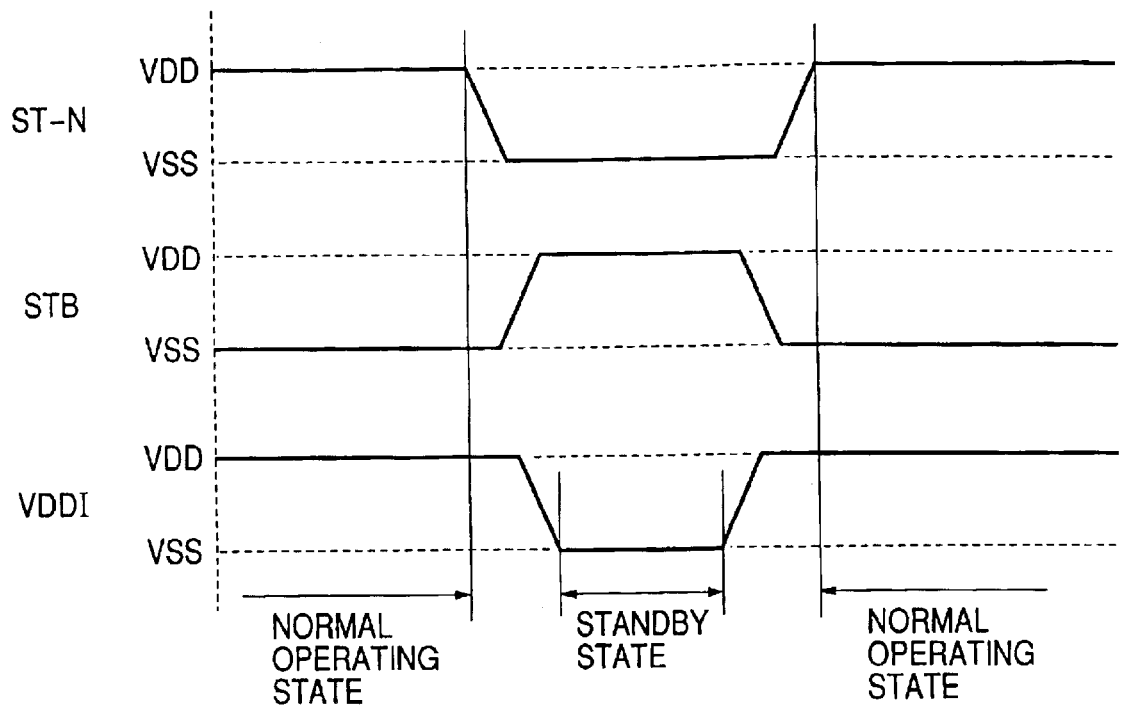
FIG. 12 is a timing chart illustrating timings for control signals for controlling the peripheral circuit.

In FIG. 11, M-LT indicates a master latch for taking in or capturing an input signal IN, S-LT indicates a slave latch for holding the signal captured by the master latch M-LT, CNT indicates a local control circuit for controlling the master latch M-LT and the slave latch S-LT, based on a clock signal CK and a control signal ST-N, and VDC indicates a power switching circuit for performing switching to a source or power supply voltage VDDI, based on a standby control signal STB, respectively. The power switching circuit VDC outputs a power supply voltage VDD when the standby control signal STB is low in level and outputs a ground voltage VSS when the standby control signal STB is high in level. The voltage VDDI (VDD or VSS) outputted from the power switching circuit VDC is supplied to power-supply voltage terminals of inverter circuits in the flip-flop circuit, to which signs VDDI are applied. FIG. 12 shows timings provided upon temporary transition of from a normal operation for each of the control signal ST-N, standby control signal STB and power supply voltage VDDI to a standby operation.

In the circuit shown in FIG. 11, each of the inverter circuits supplied with the power supply voltage VDDI performs a normal reverse operation when supplied with VDD according to the standby control signal STB. On the other hand, when the inverter circuits are supplied with VSS, no through current flows even when the input is changed, so that the inverter circuits do not operate. Further, since a leak current does not flow either, power consumption is reduced. Even in this standby state, the power supply voltage VDD is continuously applied between gates and sources of MOSFETs Q10 through Q19 that constitute a NAND gate G1 in the local control circuit CNT and inverters G2 and G3 and a transmission gate G4 in the slave latch S-LT, all of which are supplied with the power supply voltage VDD.

Therefore, these MOSFETs Q10 through Q19 are configured as elements having the same structure as MOSFETs constituting each memory cell, i.e., elements high in threshold voltage and thick in gate insulating film. Thus, even if the power supply voltage VDD is continuously applied between the gates and sources of the MOSFETs Q10 through Q19 in the standby state, it is possible to prevent subthreshold leak currents flowing between their source and drains and gate leak currents flowing between their gate electrodes and their source-drain regions.

Incidentally, while the power switching circuit VDC selects the power supply voltage VDD for some gate circuits in the flip-flop circuit in the embodiment shown in FIG. 11, such a configuration that the other power supply voltage VSS is switched to VDD so that the power supply voltages for the inverters are both brought to VDD at standby, thereby preventing the current from flowing, may be adopted. When a flip-flop circuit lying inside a logic circuit 120 takes such a circuit type as to be identical to each memory cell constituting an SRAM, the same elements as ones constituting each memory cell may be used as the elements constituting the flip-flop circuit, and the high voltage (boost or step-up voltage) identical to the memory cell may be used as the power supply voltage for the flip-flop circuit. Consequently, a logic circuit high resistant to a soft error produced due to an a ray or the like can be realized.

While the embodiment of the SRAM to which the present invention is applied, has been described above, the present invention can be applied not only to a semiconductor memory generally called an SRAM but also to an LSI generally called a system LSI wherein an SRAM is built therein as a storage or memory circuit and configured in combination with another logic-circuit.

Figure 13:
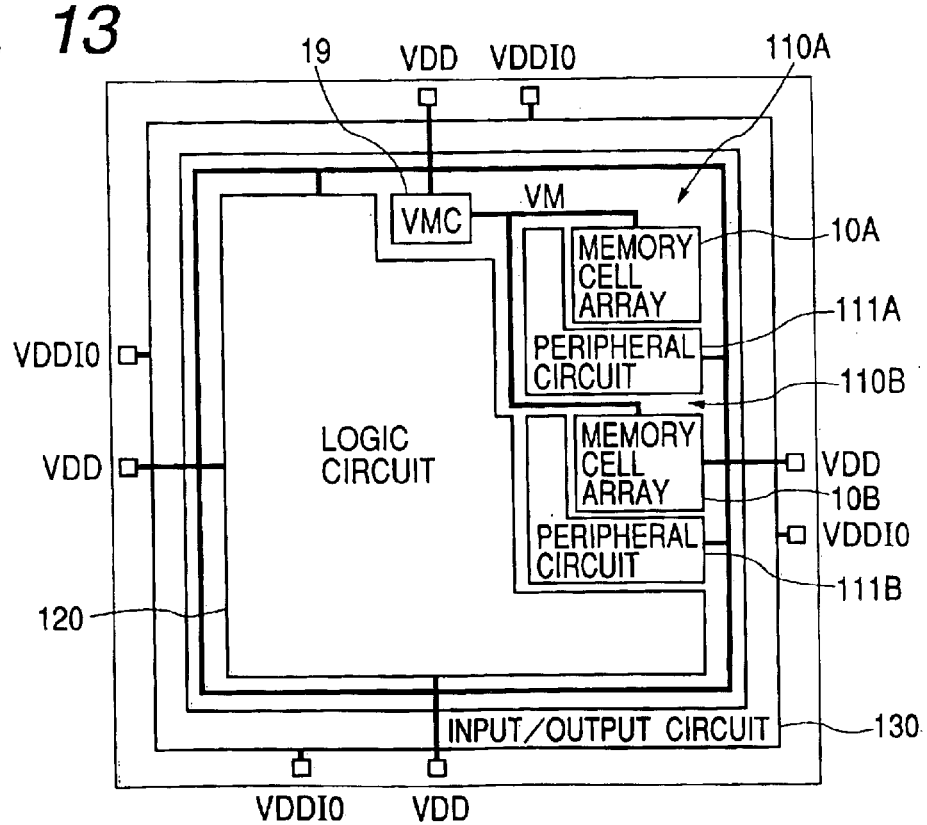
FIG. 13 is a block diagram showing a first example of a system LSI which utilizes SRAMs to which the present invention is applied and a logic circuit in combination.

FIG. 13 shows an example of a configuration of a system LSI utilizing both two SRAMs 110A and 110B to which the present invention is applied, and a logic, circuit 120 in combination, and a first specific example of a power supply system.

In the system LSI shown in FIG. 13, a booster or step-up circuit 19 for boosting a power supply voltage VDD supplied from outside is provided inside a chip. A boost or step-up voltage VM generated by the step-up circuit 19 is supplied to memory arrays 10A and 10B if the SRAMs 110A and 110B and hence an operating voltage for each memory cell is set as VM. The logic circuit 120 and peripheral circuits 111A and 111B of the SRAMs 110A and 110B are respectively supplied with the external power supply voltage VDD. Incidentally, when the SRAMs 110A and 110B are configured like the second embodiment (see FIG. 6), word drivers lying within the peripheral circuits 111A and 111B of the SRAMs 110A and 110B are also supplied with the step-up voltage VM.

In FIG. 13, reference numeral 130 indicates an input/output circuit. In the LSI according to the present embodiment, the input/output circuit 130 is supplied with a second external power supply voltage VDDIO higher than the power supply voltage VDD and different from the step-up voltage VM. Thus, the power supply voltage VDDIO of the input/output circuit 130 is set higher than the power supply voltage VDD for the internal logic circuit 120 in order to match signal levels with one another for the purpose of an interface with another LSI operated by the power supply voltage higher than that for the corresponding LSI, i.e., transmission and reception of signals to and from another LSI and to increase a noise intensity of a transmit-receive signal between the LSIs.

Incidentally, since the input/output circuit 130 is supplied with the power supply voltage VDDIO higher than the power supply voltage VDD for the internal logic circuit 120, MOSFETs thick in insulating film are used in a manner similar to the MOSFETs constituting each memory cell. The present embodiment is effective for a case in which it is desired to make the step-up voltage VM higher than the second external power voltage VDDIO. It is desirable that when the internal logic circuit 120 includes a flip-flop circuit, the flip-flop circuit is supplied with the power supply voltage VDDIO higher than the power supply voltage VDD, and MOSFETs that constitute the flip-flop circuit, make use of ones having the same structure as the MOSFETs that constitute each memory cell. Thus, a logic circuit high resistant to an a ray is obtained. The following specific examples are similar to the above.

Figure 14:
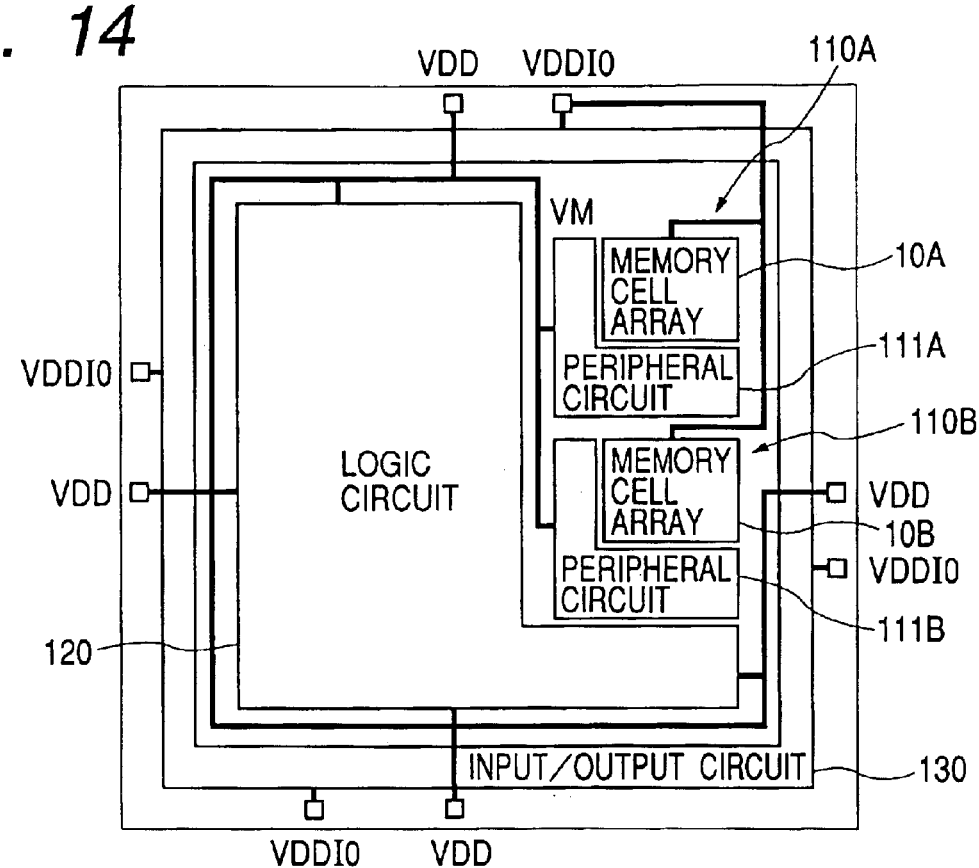
FIG. 14 is a block diagram illustrating a second example of a system LSI which utilizes SRAMs to which the present invention is applied and a logic circuit in combination.

FIG. 14 shows an example of a configuration of a system LSI utilizing both two SRAMs 110A and 110B to which the present invention is applied, and a logic circuit 120 in combination, and a second specific example of a power supply system. In the system LSI shown in FIG. 14, no booster or step-up circuit 19 is provided, memory arrays 10A and 10B of the SRAMs 110A and 1110B are supplied with a power supply voltage VDDIO for an input/output circuit 130, and hence an operating voltage for each memory cell is set as VDDIO. The logic circuit 120 and peripheral circuits 111A and 111B of the SRAMs 110A and 110B are respectively supplied with an external power supply voltage VDD. Incidentally, when the SRAMs 110A and 110B are configured like the second embodiment (see FIG. 6), word drivers lying within the peripheral circuits 111A and 111B of the SRAMs 110A and 110B are also supplied with the power supply voltage VDDIO for the input/output circuit 130. Each of the peripheral circuits 111A and 111B includes an address decoder, a column switch, an equalize & precharge circuit, a sense amplifier circuit, etc. Peripheral circuits other than the word drivers are supplied with the power supply voltage VDD. However, they are not limited to it. The sense amplifier circuit may be supplied with a voltage higher than the power supply voltage VDD.

Figure 15:
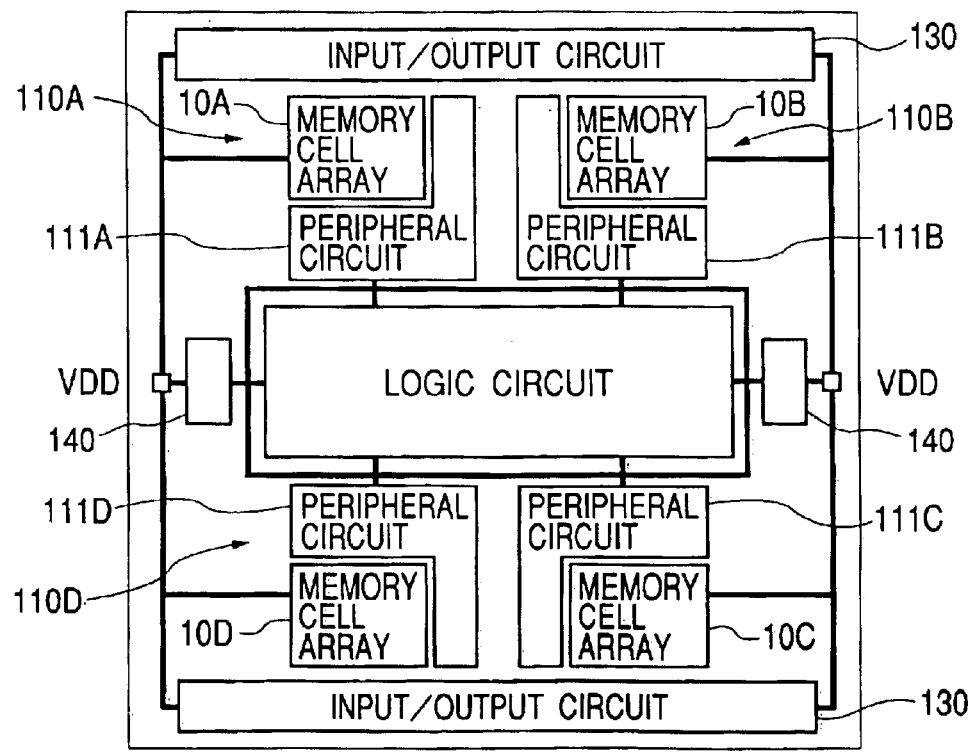
FIG. 15 is a block diagram showing a third example of a system LSI which utilizes SRAMs to which the present invention is applied and a logic circuit in combination.

FIG. 15 shows an example of a configuration of a system LSI wherein four SRAMs 110A, 10B, 110C and 110D to which the present invention is applied, and a logic circuit 120 are utilized in combination, and a third specific example of a power supply system. In the system LSI shown in FIG. 15, debooster or step-down circuits 140 for respectively stepping down an external power supply voltage VDD are provided inside a chip, and a voltage stepped down by the corresponding step-down circuit 140 is supplied to the internal logic circuit 120 and peripheral circuits 111A and 111B of the SRAMs 110A and 110B. Further, the external power supply voltage VDD is supplied to memory arrays 10A and 10B of the SRAMs 110A and 110B and an input/output circuit 130 as it is, and hence an operating voltage for each memory cell is set as VDD. Incidentally, when the SRAMs 110A and 110B are configured like the second embodiment (see FIG. 6), word drivers lying within the peripheral circuits 111A and 111B of the SRAMs 110A and 110B are also supplied with the external power supply voltage VDD.

A description will next be made of a method of forming a gate insulating film for MOSFETs that constitute each memory cell.

A first specific example of the gate insulating film for the MOSFETs that constitute the memory cell, is a method of forming the gate insulating film for the MOSFETs constituting each memory cell as an insulating film made up of the same material and having the same thickness, which is formed in the same process step as a gate insulating film for MOSFETs constituting an input/output circuit, in an LSI having the input/output circuit operated at a power-supply voltage higher than a power supply voltage for an internal logic circuit as in the LSI according to the above embodiment. According to this method, the present invention can be applied without any change in process, and an increase in cost can be avoided.

A second specific example of the gate insulating film for the MOSFETs that constitute each memory cell, is a method of properly using a silicon oxide film ($SiO_2$) and a gate insulating film (hereinafter called "High-K film") made up of a material high in dielectric constant.

There has recently been a proposal that a material like, e.g., $TiO_2$ or $Ta_2O_5$ higher in dielectric constant than $SiO_2$ and SiON is used as the gate insulating film for the MOSFETs. In the case of MOSFETs using the gate insulating film (hereinafter called "High-K film") which is made up of such a material high in dielectric constant, the same characteristic can be obtained even if the thickness thereof is made thick as compared with MOSFETs with the $SiO_2$ film as a gate insulating film. Therefore, when a high voltage is applied to a gate electrode owing to the increase in thickness, such a gate leak current that an electrical charge passes through the gate insulating film by a tunnel effect, can be suppressed.

Thus, the High-K film may be used as the gate insulating film for the MOSFETs that constitute each of the peripheral circuit and logic circuit, and the normal $SiO_2$ film may be used as the gate insulating film for the MOSFETs that constitute each memory cell. Incidentally, while the gate insulating film for the MOSFETs that constitute the memory cell has been made thicker than the gate insulating film for the MOSFETs that constitute each of the peripheral circuit and logic circuit in the above embodiment, it is also considered that when the gate insulating films are properly used as described above, the portion for each memory cell and the portion for each peripheral circuit become identical in the thickness of the gate insulating film. Namely, the terms of "the gage insulating film for the MOSFETs that constitute each memory cell is made thicker than the gate insulating film for the MOSFETs that constitute each peripheral circuit" in the above embodiment involves that the gate insulating film is thick where conversion to the thickness at that time that they are formed of the same material, is made. Further, it can be said in a broad sense that the thicknesses of the respective gate insulating films are determined such that a gate leak current per unit area of the gate insulating film for the MOSFETs that constitute each memory cell, becomes smaller than a gate leak current per unit area of the gate insulating film for the MOSFETs that constitute each of the peripheral circuit and the logic circuit, regardless of the material.

Further, a laminated film of the High-K film and $SiO_2$ film or SiON film can be used as the gate insulating film for the MOSFETs. In this case, the High-K film may be formed as identical in thickness between the MOSFETs that constitute each memory cell and the MOSFETs that constitute each of the peripheral circuit and logic circuit. The thickness of the $SiO_2$ film or SiON film used as the gate insulting film for the MOSFETs that constitute each memory cell, may be made thicker than each peripheral circuit. Further, the reason why the thick gate insulating film is used in a broad sense, is that the use thereof might be intended only for information holding MOSFETs MP0, MP1, MD0 an MD1 excluding the transmission MOSFETs MT0 and MT1 except for all the MOSFETs that constitute the memory cells. In addition, some MOSFETs that constitute each word driver are configured as MOSFETs of an insulating film thick in a broad sense in the second embodiment in which the word-line selection level is set as the high voltage similar to the power supply voltage of each memory cell.

While the invention made above by the present inventors has been described specifically based on the illustrated embodiments, the present invention is not limited to the above embodiments. It is needless to say that various changes can be made thereto within the scope not departing from the substance thereof.

While the above embodiments have described the peripheral circuits for the memory arrays and the logic circuit in distinction from one another where the present invention is applied to the static RAM (unit or single memory), and the system LSI having the static RAM and the logic circuit built therein, such a distinction may be a convenient one and it should be considered not to be important upon application of the present invention Namely, since one having built therein one considered to be a general logic circuit such as an error correcting circuit has recently been proposed except for peripheral circuits in a narrow sense even in the case of a single memory, even the single memory can be regarded as a semiconductor integrated circuit including a memory array, peripheral circuits and a logic circuit. Since an address decode circuit and the like can be made up of basic logic gate cells of a gate array with an SRAM built therein, such an LSI can be regarded as a semiconductor integrated circuit comprising a memory array and peripheral circuits even if it is not a single memory.

While the above description has principally been made of the case in which the invention made by the present inventors is applied to the static RAM (unit or single memory) and the system LSI with the static RAM and the logic circuit built therein, which belong to the field of application corresponding to the background of the invention, the present invention is not limited to it. The present invention can be widely used in a semiconductor integrated circuit such as a logic LSI having a flip-flop circuit built therein, which has a configuration similar to each memory cell of the static RAM.

Advantageous effects obtained by typical ones of the inventions disclosed in the present application will be described in brief as follows:

Namely, according to the present invention, an advantage effect is brought about in that since the operating voltage of each memory cell is high and the threshold voltages of MOSFETs constituting each memory cell are high, the memory cell can be reduced in leak current and power consumption, and since the operating voltage of each of peripheral circuits is lower than the operating voltage of the memory cell, the operating speed of the peripheral circuit can be made fast, thus making it possible to enhance read and write rates over the whole semiconductor memory device.

An advantageous effect is brought about in that each of memory cells can be reduced in leak current and power consumption since the operating voltage of each memory cell is high and the threshold voltages of MOSFETs that constitute the memory cell, are high, the operating speed of each of peripheral circuits can be made fast because the operating voltage of the peripheral circuit is lower than that of the memory cell, thus making it possible to enhance read and write rates over the whole semiconductor memory device, and a read current can be considerably increased because a word-line selection level is high, whereby a read rate can be made fast.

What is claimed is:

1. A semiconductor memory device, comprising:

a memory array including a plurality of memory cells, a plurality of word lines, a plurality of bit line pairs; and a peripheral circuit including a decoder circuit which selects at least one memory cell in the memory array, driver circuits which drive the plurality of word lines to select levels, and a sense amplifier circuit which amplifies a potential on each of the bit line pair;

said each memory cell including a flip-flop circuit including a first inverter and a second inverter, and a pair of transmission MOS transistors respectively connected between the flip-flop circuit and the bit line pair connected to input/output nodes of the flip-flop circuit, wherein an operating voltage of the memory cell and an operating voltage of the driver circuit are higher than an operating voltage of the decoder circuit, a threshold voltage of each MOS transistor included in the memory cell is higher than a threshold voltage of each MOS transistor included in the decoder circuit, a gate insulating film for the MOS transistors included in the memory cell is thicker than a gate insulating film for the MOS transistors included in the decoder circuit, and a selection level for the word line is higher than the level of the operating voltage of the decoder circuit.

2. The semiconductor memory device according to claim 1, wherein the ratio between a gate width and a gate length of each transmission MOS transistor included in the memory cell is identical to or set smaller than the ratio between a gate width and a gate length of each of N channel MOS transistors included in the first inverter and the second inverter.

3. The semiconductor memory device according to claim 1, wherein the ratio between a gate width and a gate length of a P channel load MOS transistor included in each of the first inverter and the second inverter is substantially identical to or set larger than the ratio between the gate width and gate length of each transmission MOS transistor included in the memory cell.

4. The semiconductor memory device according to claim 2, wherein a precharge level for the bit line pair is set lower than a selection level for the word line.

5. The semiconductor memory device according to claim 4, wherein the word-line selection level is set higher than a potential obtained by adding the threshold voltage of the transmission MOS transistor to the precharge level for the bit line pair, and the ratio between the gate width and gate length of the P channel load MOS transistor is greater than 0.9 times the ratio between the gate width and gate length of the transmission MOS transistor.

6. The semiconductor memory device according to claim 4, wherein the word-line selection level is set lower than a potential obtained by adding the threshold voltage of the transmission MOS transistor to the precharge level for the bit line pair, the ratio between the gage width and gate length of the P channel load MOS transistor is identical to or set smaller than the ratio between the gate width and gate length of the transmission MOS transistor, and the ratio between the gate width and gate length of the transmission MOS transistor is identical to or smaller than the ratio between the gate width and gate length of the N channel MOS transistor.

7. The semiconductor memory device according to claim 1, wherein the word-line selection level is the same potential as the operating voltage of the memory cell.

8. The semiconductor memory device according to claim 1, further including a step-up circuit which boosts a power supply voltage supplied from outside, wherein the memory cell and each of the driver circuits respectively use a voltage boosted by the step-up circuit as an operating voltage.

* * * * *